(12) United States Patent
Scheucher

(10) Patent No.: US 7,456,489 B2
(45) Date of Patent: Nov. 25, 2008

(54) WAFER WITH OPTICAL CONTROL MODULES IN IC FIELDS

(75) Inventor: Heimo Scheucher, Langegg (AT)

(73) Assignee: NXP B.V., Eindhoven (NL)

(*) Notice: Subject to any disclaimer, the term of this patent is extended or adjusted under 35 U.S.C. 154(b) by 142 days.

(21) Appl. No.: 10/584,095

(22) PCT Filed: Dec. 9, 2004

(86) PCT No.: PCT/IB2004/052724

§ 371 (c)(1),
(2), (4) Date: Jun. 22, 2006

(87) PCT Pub. No.: WO2005/064679

PCT Pub. Date: Jul. 14, 2005

(65) Prior Publication Data

US 2007/0158798 A1 Jul. 12, 2007

(30) Foreign Application Priority Data

Dec. 23, 2003 (EP) .................................. 03104956

(51) Int. Cl.
*H01L 29/06* (2006.01)
*H01L 23/544* (2006.01)

(52) U.S. Cl. ...................................... 257/618; 257/620

(58) Field of Classification Search .......... 257/618–620
See application file for complete search history.

(56) References Cited

U.S. PATENT DOCUMENTS 6,114,072 A * 9/2000 Narimatsu .................. 438/462
2003/0211700 A1 * 11/2003 Leung et al. ................ 438/401

FOREIGN PATENT DOCUMENTS

JP 59 094418 5/1984
WO WO 02/069389 9/2002

* cited by examiner

Primary Examiner—Cuong Q Nguyen

(57) ABSTRACT

In a wafer (1) with a number of exposure fields (2), each of which exposure fields comprises a number of lattice fields (3) with an IC (4) located therein, two groups (5, 7) of saw paths (6, 8) are provided and two control module fields (A1, A2, B1, B2, C1, C2, D1, D2) are assigned to each exposure field, each of which control module fields contains at least one optical control module (OCM-A1, OCM-A2, OCM-B1, OCM-B2, OCM-C1, OCM-C2, OCM-D1, OCM-D2) and lies within the exposure field in question and comprises a plurality of control module field sections (A11, A12 ... A1N and A21, A22 ... A2N and B11, B12 ... B1N and B21, B22 ... B2N and C1N and C2N and D1N and D2N) and is distributed among several lattice grids (3), wherein each control module field section (A11 to D2N) is located in a lattice field and contains at least one control module component (10,11,12,13,14,15,16,17,18).

4 Claims, 2 Drawing Sheets

WAFER WITH OPTICAL CONTROL MODULES IN IC FIELDS

The invention relates to a wafer, which wafer comprises a number of exposure fields and which wafer comprises a number of lattice fields in each exposure field, wherein each lattice field contains an IC and each IC contains a plurality of IC components, and which wafer comprises a first group of first saw paths and a second group of second saw paths, wherein all of the first saw paths of the first group run parallel to a first direction and have a first path width and wherein all of the second saw paths of the second group run parallel to a second direction intersecting the first direction and have a second path width, and wherein the first saw paths and the second saw paths are provided and designed for a subsequent segregation of the lattice fields and the ICs contained therein, and wherein in each exposure field at least two control module fields are provided, each of which control module fields runs parallel to the first direction and thus to the first saw paths and contains at least one optical control module, wherein each control module contains a plurality of control module components.

Such a wafer according to the design described in the first paragraph is known, for instance, from patent specification U.S. Pat. No. 6,114,072 A, wherein the design described with reference to FIG. 21 deserves particular attention. The known wafer is so designed that a first control module field of each exposure field immediately adjoins a first edge of the exposure field in question and that a second control module field of each exposure field immediately adjoins the second edge of the exposure field in question. Each control module field lies in a half of a first saw path. As a result of this design, a first control module field and a second control module field of the two exposure fields in question lie between two rows of lattice fields of two exposure fields, which are arranged immediately adjacent to one another in the second direction, so that the distance extending in the second direction between two rows of lattice fields of two exposure fields, which are arranged immediately adjacent to one another in the second direction, is determined by the double value of the width of a control module field. Owing to the fact that two such first control module fields lie between two rows of lattice fields of two exposure fields, which are arranged immediately adjacent to one another in the second direction, and of the fact that each control module field lies in a half of a first saw path and two adjacent control module fields, therefore determine the width of a whole first saw path and that all parallel saw paths of a wafer, including the first saw paths between the lattice fields within each exposure field, which run parallel to the first direction, must be of equal width if the stepper steps required in the production of the wafer and the production of the ICs are to be completed precisely in the testing, sawing and assembly phases, the first saw paths running between the ICs of each exposure field also have to have the double width of the control module fields. As a result, a not insignificant proportion of the wafer surface is required for the totality of all saw paths, which constitutes undesirable waste.

It is an object of the invention to eliminate the facts described above and to create an improved wafer.

To solve this problem, features according to the invention are provided in a wafer according to the invention, so that a wafer according to the invention can be characterized in the following way:

Wafer, which wafer comprises a number of exposure fields and which wafer comprises a number of lattice fields in each exposure field, wherein each lattice field contains an IC and each IC contains a plurality of IC components, and which wafer comprises a first group of first saw paths and a second group of second saw paths, wherein all of the first saw paths of the first group run parallel to a first direction and have a first path width and wherein all of the second saw paths of the second group run parallel to a second direction intersecting the first direction and have a second path width, and wherein the first saw paths and the second saw paths are provided and designed for a subsequent segregation of the lattice fields and the ICs contained therein, and wherein in each exposure field at least two control module fields are provided, each of which control module fields runs parallel to the first direction and thus to the first saw paths and contains at least one optical control module, wherein each control module contains a plurality of control module components, and wherein each control module field located within an exposure field comprises a plurality of control module field sections and is distributed among several lattice fields, and wherein each control module field section is located in a lattice field and contains at least one control module component.

By the provision of the features according to the invention, it can be achieved in a simple way and without any additional costs that there is no control module field between two exposure fields immediately adjacent to one another in the second direction, so that the distance extending in the second direction between two exposure fields is determined only by the width of a first saw path. As a result, the width of the saw paths provided between adjacent lattice fields is expediently likewise determined by the width of a first saw path only, so that the surface area of a wafer according to the invention can be utilized much better than that of a wafer according to prior art. In a wafer according to prior art, the width of the first saw paths running between the lattice fields and of the control module fields are known to lie in the range between 90 μm and 120 μm, whereas in a wafer according to the invention—depending on the wafer manufacturing technology and the wafer process technology used—the widths of the first saw paths and of the control module fields are or can be reduced to values between 80 μm and 20 μm or 15 μm or 10 μm respectively, wherein particularly thin saw blades are used for widths between 80 μm and 50 μm and the very small widths are subject to the precondition that so-called laser saws are used for the subsequent segregation of the lattice fields or ICs, wherein so-called "red lasers" or "blue lasers" are used. The technologies known among experts under the names of "stealth dicing" and "scribe & break dicing" can also be applied. Added to this is the advantage that virtually the whole of all lattice fields can be and is used to implement at least one IC each and only a very small area in all lattice fields, i.e. in each IC of each lattice field, is required for the implementation of the control modules.

In a wafer according to the invention, it has been found to be particularly advantageous if each control module field section in each lattice field is located in the same position, in which position the IC in the lattice field in question does not have any IC components. In this way, an area in a lattice field, which area is not used for the implementation of the IC contained in said lattice field, which is, however, too small for the implementation of a complete control module, can expediently be used to implement at least one control module component.

In a wafer according to the invention, it has further been found to be very advantageous if the at least two control module fields of each exposure field are arranged at an average distance from one another extending in the second direction, which average distance is equal to at least a quarter of the side length of a side of the exposure field which extends in the second direction. In this way, the distance between the at least two control module fields of each exposure field is large enough to fulfill the minimum requirements of manufacturing accuracy, which is advantageous with regard to the precise execution of the process steps executable or executed while using the optical control modules.

In a wafer according to the invention, the average distance can be equal to slightly more than a quarter (¼) or slightly less or slightly more than a half (½) or slightly less or slightly more than three quarters (¾) of the side length of a side of the exposure field which extends in the second direction. It has, however, been found to be particularly advantageous if the average distance is equal to the whole side length of a side of the exposure field which extends in the second direction minus the side length of a side of a lattice field which extends in the second direction. This ensures as large a distance as possible between the at least two control module fields of each exposure field, which is advantageous with regard to the highly precise execution of the process steps executable or executed while using the optical control modules.

It is advantageous if only two control module fields are provided in each exposure field and if these two control module fields are located at as large a distance as possible from one another. This ensures a high precision in the process steps executed while utilizing the control modules or the control module components. It can be mentioned that three or four control module fields can be provided in each exposure field, with their control module field sections being distributed among ICs in the exposure field in question. It can further be mentioned that each exposure field can have the shape of a triangle, with a control module field located near each corner region or a control module field being provided near two corner regions only.

It should finally be mentioned that the use of the measures according to the invention has been or is found to be most useful if the wafer is provided and used for the implementation of ICs with an IC surface area of approximately 0.5 to 10.0 mm×0.5 to 10.0 mm, i.e. approximately 0.25 to 100.0 mm². It is further useful if the exposure fields are approximately 21.0 mm×21.0 mm in size and if approximately 320 to 128 000 ICs (chips) are implemented on the wafer if its diameter is, for instance, 8.0 inches, amounting to a usable area of approximately 32 000 mm² for ICs. The measures according to the invention can, however, also be applied in wafers with a diameter of 4.0, 5.0, 6.0 and 12.0 inches.

These and other aspects of the invention are apparent from and will be elucidated with reference to the embodiments described hereinafter.

The invention is described further below with reference to an embodiment illustrated in the drawings, to which embodiment the invention is, however, not restricted.

Figure 1:
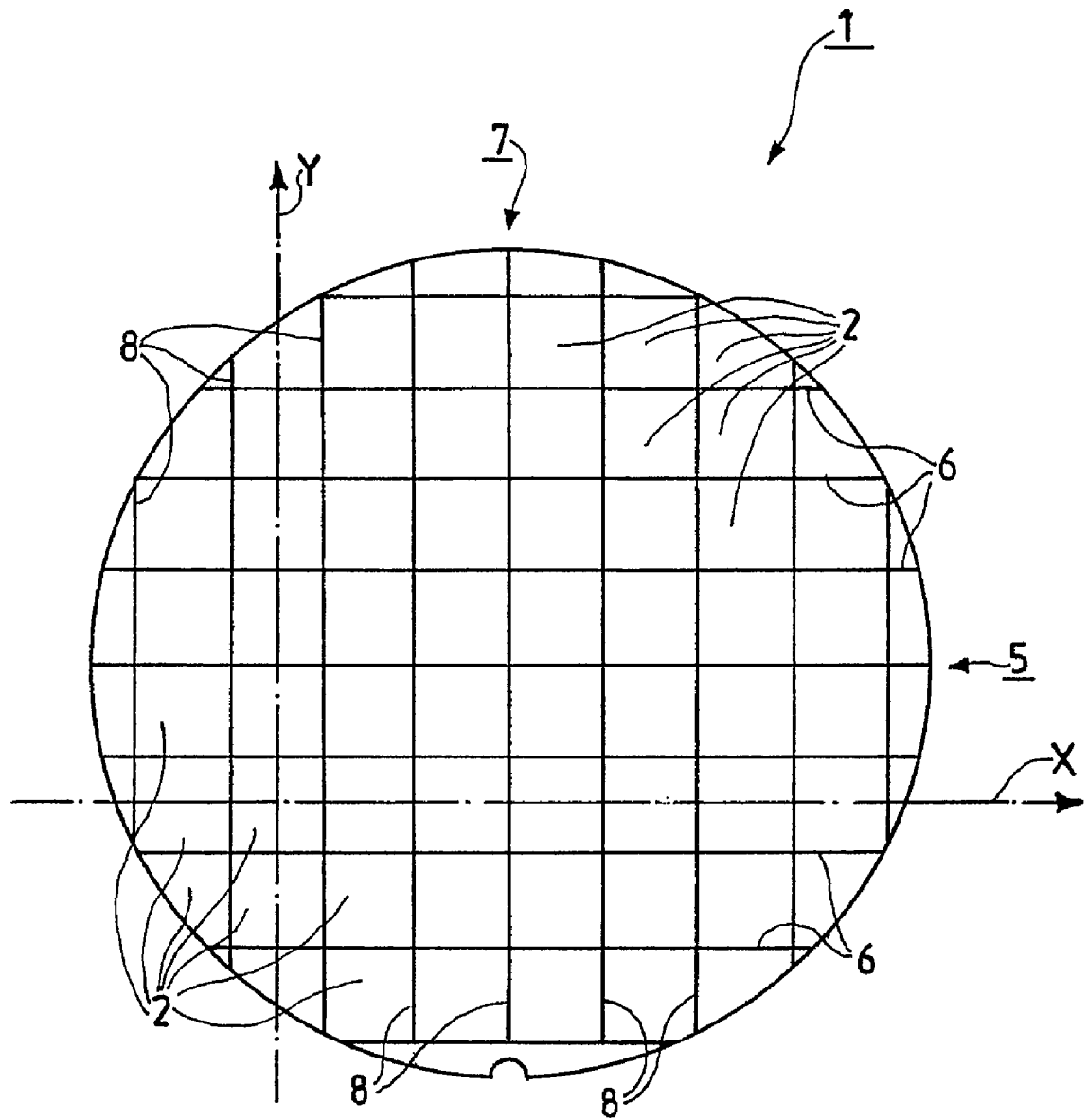
FIG. 1 is a diagrammatic top view of a wafer according to an embodiment of the invention.

FIG. 1 shows a wafer 1. The wafer 1 has semi-conductor characteristics in the known way. The wafer 1 is based on silicon. The wafer 1 can, however, alternatively based on a polymer to obtain so-called polymer ICs with the aid of the wafer.

Figure 2:
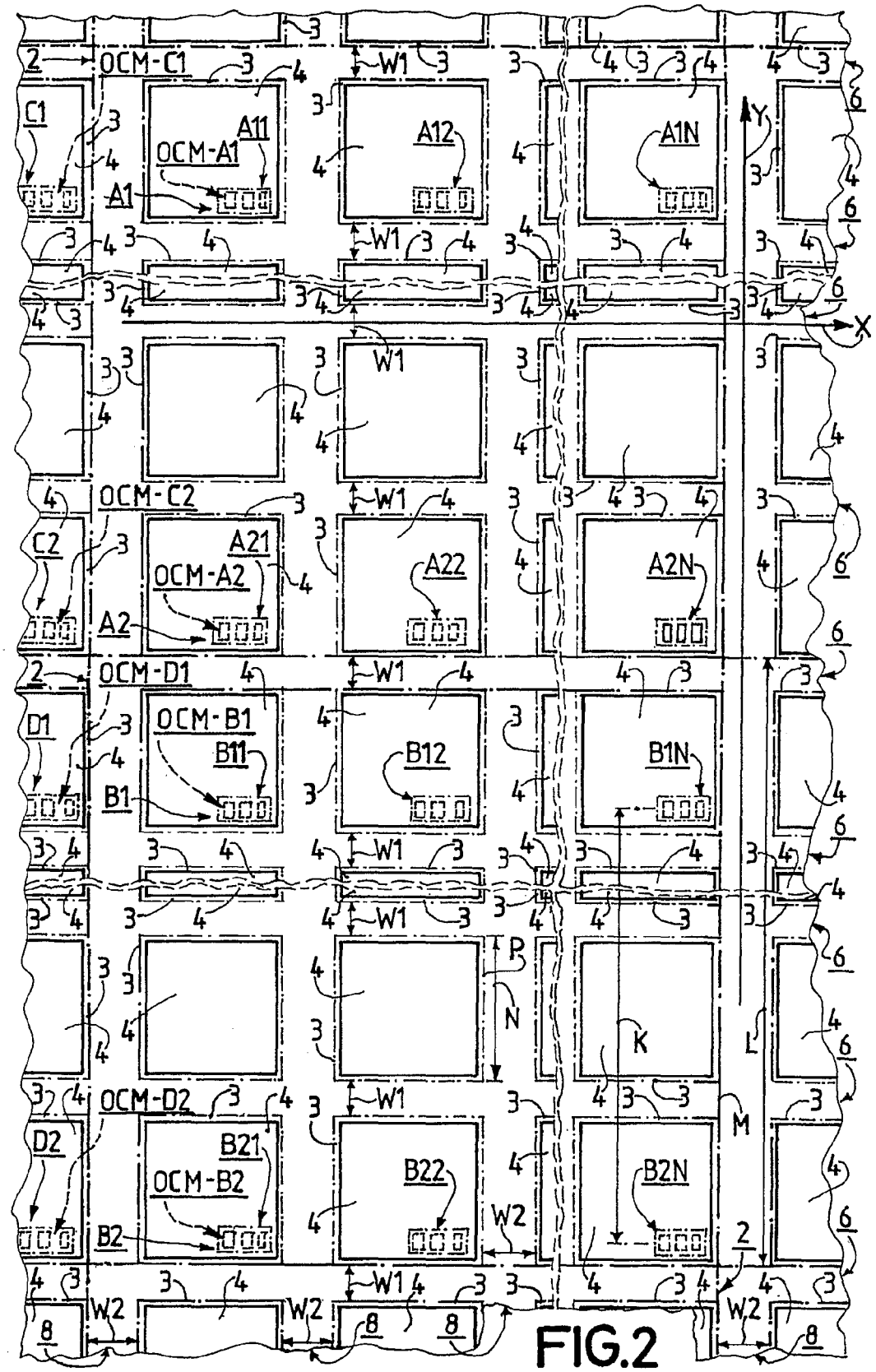
FIG. 2 is a section of the wafer according to FIG. 1, which is considerably enlarged compared to FIG. 1.

The wafer 1 comprises a number of exposure fields 2. In FIG. 1, the exposure fields 2 are shown without the components they contain. FIG. 2 only shows two complete exposure fields 2 by means of broken lines. As FIG. 2 illustrates, the wafer 1 has a number of intersecting and lattice-like saw path sections 6A, 6B, 6C, 8A, 8B 8C, 8D in each exposure field 2. The wafer 1 further comprises a number of lattice fields 3 between the saw path sections 6A, 6B, 6C, 8A, 8B 8C, 8D, wherein each lattice field 3 contains one IC 4. Each IC 4 includes a plurality of IC components as has been known for a long time. The IC components are not shown in FIGS. 1 and 2. Small areas of each IC 4 do not contain any IC components.

The wafer 1 comprises a first group 5 of first saw paths 6 and a second group 7 of second saw paths 8. All of the first saw paths 6 of the first group 5 run parallel to a first direction X indicated by a dot-dash line in FIG. 1. All of the second saw paths 8 of the second group 7 run parallel to a second direction Y intersecting the first direction X and likewise indicated by a dot-dash line in FIG. 1. In the wafer 1, the first direction X and the second direction Y intersect at right angles. This is, however, not absolutely necessary, and the two directions X and Y can intersect at an angle other than 90°, for instance at an angle of 85°, 80°, 75° or 70°. All of the first saw paths 6 have a first path width W1. All of the second saw paths 8 have a path width W2. In the wafer 1, the two path widths W1, W2 are different, the first path width W1 being less than the second path width W2. This is, however, not absolutely necessary, and the two path widths W1 and W2 may be equal, which is usually preferred. It is also possible to choose a first path width W1 larger than the second path width W2. The first saw paths 6 comprise several first saw path sections 6A, 6B, 6C arranged consecutively in the first direction X, while the second saw paths 8 comprise several second saw path sections 8A, 8B, 8C, 8D arranged consecutively in the second direction Y. The first saw paths 6 and the second saw paths 8 are provided and designed for the subsequent segregation of the lattice fields 3 and thus of the ICs contained therein.

With regard to the saw paths, it should here be mentioned that in a wafer wherein the first saw paths and the second saw paths intersect at an angle other than 90°, a third group of third saw paths can be provided, resulting in a wafer with triangular lattice fields and triangular ICs. In this case, the design can be so chosen that the saw paths of the three groups intersect at an angle of 60°, giving the lattice fields and the ICs the planar shape of an equilateral triangle. This is, however, not necessary, because other angular relationships and thus other triangle shapes are feasible as well. The first, second and third saw paths can have equal or different path widths.

The wafer 1 comprises control module fields, each of which contains an optical control module. The provision of optical control modules on a wafer as such has been known for some time. These optical control modules contain square or rectangular interference fields detectable, depending on size, either by the naked eye or by computer-aided detection devices and used for mask adjustment and layer thickness testing. The design of the control module fields and the optical control modules contained therein in the wafer 1 according to FIG. 1 is described in detail below with reference to FIG. 2.

In the wafer 1 according to FIGS. 1 and 2, two control module fields A1, A2, B1, B2, C1, C2, D1, D2 are assigned to each exposure field 2. Each of these control module fields A1, A2, B1, B2, C1, C2, D1, D2 runs parallel to the first direction and thus to the first saw paths 6. Each of the control module fields A1, A2, B1, B2, C1, C2, D1, D2 contains an optical control module. An optical control module of this type has a known three-dimensional structure, because a control module component is implemented in each process step, with the result that at least a control module component of an optical control module which is implemented in a last process step is visible from outside of the wafer 1 or detectable by means of a computer-based detection device, whereas any control module components of a control module which have been implemented in a process step executed before the last process step are not visible or detectable from outside of the wafer. In FIG. 2, the control modules in the control module fields A1, A2, B1, B2, C1, C2, D1, D2 are identified by the reference numbers OCM-A1, OCM-A2, OCM-B1, OCM-B2, OCM-C1, OCM-C2, OCM-D1, OCM-D2. Reference numbers for the control module components are only entered for the optical control module OCM-B1 in FIG. 2. The control module components located deeper inside the wafer 1 and therefore less visible from outside of the wafer 1 and indicated by broken lines have been given the reference numbers 10, 11, 12, 13, 14 and 15. The three control module components located higher in the wafer 1 and therefore visible from outside of the wafer 1 have been given the reference numbers 16, 17 and 18.

As FIG. 2 indicates, the two control module fields A1, A2, B1, B2, C1, C2, D1, D2 of each exposure field 2 are located within the exposure field 2 in question, and each control module field A1, A2, B1, B2, C1, C2, D1, D2 within an exposure field 2 comprises several control module field sections A11, A12, . . . A1N and A21, A22, . . . A2N and B11, B12, . . . B1N and B21, B22, . . . B2N and C1N and C2N and D1N and D2N. Each control module field section A11 to D2N is located in a lattice field 3. Each control module field section A11 to D2N contains at least one control module component 10, 11, 12, 13, 14, 15, 16, 17, 18. FIG. 2 shows that each control module field section A11 to D2N contains the same number of control module components, i.e. three control module components. This is not absolutely necessary, because the control module field sections A11 to D2N can contain different numbers of control module components, for instance only one or two control module components, but also four, five, six or more such control module components.

In the wafer 1, the control module field sections A11 to D2N are so arranged that each control module field section A11 to D2N is located in the same position in each lattice field 3. In this position, the IC 4 in the lattice field 3 in question does not have any IC components. In other words, a wafer area not required for the implementation of the IC 4 in question is used to implement the control module components contained in each control module field section A11 to D2N.

As FIG. 2 further shows, the control module fields A1, A2, B1, B2, C1, C2, D1, D2 of each exposure field 2, which are arranged consecutively in the second direction Y, are, if viewed in the second direction Y, arranged at an average distance K from one another in the second direction Y. In the present case, this average distance K is equal to the whole side length L of a side M of an exposure field 2 which extends in the second direction Y minus the side length N of a side P of a lattice field 3 which extends in the second direction Y. Though the average distance K may be smaller, it has been found to be advantageous if the average distance K is equal to at least a quarter of the side length L of a side K of an exposure field 2 which extends in the second direction Y.

The wafer 1 offers the great advantage that each control module field A1, A2, B1, B2, C1, C2, D1, D2 is located within an exposure field 2, so that no space is required for the control module fields A1, A2, B1, B2, C1, C2, D1, D2 outside of the exposure fields 2, with the result that the saw paths 6 running parallel to the first direction X can be designed particularly narrow and are therefore designed narrow. In a wafer 1 according to FIGS. 1 and 2, all saw paths 6 have a first path width W1 of 50 µm. The first path width may alternatively be 60 µm or 70 µm or 40 µm or even less, for instance 30 µm or 20 µm or in future technologies even only 10 µm, because the first path width W1 is in the present case exclusively determined by the cutting or separation equipment with which the wafer is cut or divided to segregate the ICs. The wafer 1 further offers the advantage that no lattice fields 3 are required for the implementation of the control modules OCM-A1, OCM-A2, OCM-B1, OCM-B2, OCM-C1, OCM-C2, OCM-D1, OCM-D2, but the whole area of an exposure field 2 is available for the implementation of ICs 4, allowing for the optimum utilization of the whole wafer surface for the production of ICs 4.

With regard to the control modules OCM-A1, OCM-A2, OCM-B1, OCM-B2, OCM-C1, OCM-C2, OCM-D1, OCM-D2, is should finally be mentioned that the control modules OCM-A1, OCM-A2, OCM-B1, OCM-B2, OCM-C1, OCM-C2, OCM-D1, OCM-D2 preferably have the dimensions stated below, i.e. a dimension of approximately 40.0 µm in the first direction X and a dimension of approximately 40.0 µm in the second direction Y. Since actual dimensions depend on the technology used, smaller dimensions, such as approximately 30.0 µm or 20.0 µm, are achievable in highly modern technologies and developing technologies.

In the wafer 1, the surface areas of the ICs 4 are slightly smaller than those of the lattice fields 3. The surface areas of the ICs 4 may, however, be equal to the surface areas of the lattice fields if preferred.

In a wafer according to the invention, three, four, five, six or more control module fields can be provided instead of a total of two control module fields per exposure field. The number of control modules is determined by the technology used in the production of the wafer and of the ICs located thereon.

It can finally be mentioned that the wafer 1 further includes so-called process control modules (PCMs) located in the second saw paths 8 running parallel to the second direction Y. A solution as described in patent specification WO 02/069.389 A2 can, however, be provided as an alternative.

The invention claimed is:

1. A wafer which wafer comprises a number of exposure fields and which wafer comprises a number of lattice fields in each exposure field, wherein each lattice field contains an IC and each IC contains a plurality of IC components, and which wafer comprises a first group of first saw paths and a second group of second saw paths wherein all of the first saw paths of the first group run parallel to a first direction and have a first path width and wherein all of the second saw paths of the second group run parallel to a second direction intersecting the first direction and have a second path width and wherein the first saw paths and the second saw paths are provided and designed for a subsequent segregation of the lattice fields and the ICs contained therein, and wherein in each exposure field at least two control module fields are provided, each of which control module fields runs parallel to the first direction and thus to the first saw paths and contains at least one optical control module, wherein each control module contains a plurality of control module components, and wherein each control module field within an exposure field comprises a plurality of control module field sections and is distributed among several lattice fields, and wherein each control module field section is located in a lattice field and contains at least one control module component.

2. A wafer as claimed in claim 1, wherein each control module field section in each lattice field is located in the same position, in which position the IC in the lattice field in question does not have any IC components.

3. A wafer as claimed in claim 1, wherein the at least two control module fields of each exposure field are arranged at an average distance from one another extending in the second direction, which average distance is equal to at least a quarter of the side length of a side of the exposure field which extends in the second direction.

4. A wafer as claimed in claim 3, wherein the average distance is equal to the whole side length of a side of the exposure field which area extends in the second direction minus the side length of a side of a lattice field which extends in the second direction.

* * * * *